United States Patent
Tsai et al.

(10) Patent No.: US 8,396,583 B2
(45) Date of Patent: Mar. 12, 2013

(54) METHOD AND SYSTEM FOR IMPLEMENTING VIRTUAL METROLOGY IN SEMICONDUCTOR FABRICATION

(75) Inventors: Po-Feng Tsai, Taipei (TW); Andy Tsen, Chung-Ho (TW); Jo Fei Wang, Hsin-Chu (TW); Jong-I Mou, Hsinpu Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 447 days.

(21) Appl. No.: 12/731,407

(22) Filed: Mar. 25, 2010

(65) Prior Publication Data

US 2011/0238198 A1 Sep. 29, 2011

(51) Int. Cl.
*G06F 19/00* (2006.01)
(52) U.S. Cl. .................. 700/104; 700/117; 702/182
(58) Field of Classification Search .......... 700/95, 700/104, 117; 702/182
See application file for complete search history.

(56) References Cited

U.S. PATENT DOCUMENTS

| | | | |
|---|---|---|---|
| 7,475,825 B2* | 1/2009 | Silverbrook et al. | 235/494 |
| 2002/0002414 A1* | 1/2002 | Hsiung et al. | 700/95 |
| 2003/0109951 A1* | 6/2003 | Hsiung et al. | 700/108 |
| 2007/0185684 A1* | 8/2007 | Vuong et al. | 702/182 |
| 2008/0163140 A1* | 7/2008 | Fouquet et al. | 716/4 |
| 2009/0228247 A1* | 9/2009 | Hendler et al. | 703/2 |
| 2010/0138026 A1* | 6/2010 | Kaushal et al. | 700/104 |

* cited by examiner

*Primary Examiner* — Mohammad Ali
*Assistant Examiner* — Anthony Whittington
(74) *Attorney, Agent, or Firm* — Haynes and Boone, LLP

(57) ABSTRACT

The present disclosure provides a method of fabricating a semiconductor device. The method includes collecting a plurality of manufacturing data sets from a plurality of semiconductor processes, respectively. The method includes normalizing each of the manufacturing data sets in a manner so that statistical differences among the manufacturing data sets are reduced. The method includes establishing a database that includes the normalized manufacturing data sets. The method includes normalizing the database in a manner so that the manufacturing data sets in the normalized database are statistically compatible with a selected one of the manufacturing data sets. The method includes predicting performance of a selected one of the semiconductor processes by using the normalized database. The selected semiconductor process corresponds to the selected manufacturing data set. The method includes controlling a semiconductor processing machine in response to the predicted performance.

20 Claims, 7 Drawing Sheets

METHOD AND SYSTEM FOR IMPLEMENTING VIRTUAL METROLOGY IN SEMICONDUCTOR FABRICATION

TECHNICAL FIELD

The present disclosure relates generally to a metrology model, and more particularly, to a method and system for implementing virtual metrology in semiconductor fabrication.

BACKGROUND

Semiconductor integrated circuits are produced by a plurality of processes in a wafer fabrication facility (fab). These processes, and associated fabrication tools, may include thermal oxidation, diffusion, ion implantation, RTP (rapid thermal processing), CVD (chemical vapor deposition), PVD (physical vapor deposition), epitaxy, etch, and photolithography. During the fabrication stages, semiconductor wafers are monitored for quality assurance and yield using various metrology tools.

Virtual metrology is a technique that forecasts results of a semiconductor process based on modeling and previously collected data (also referred to as training data). As semiconductor fabrication progresses to advanced technology node processes (e.g., 90 nm to 65 nm to 45 nm to 32 nm and beyond), practical implementation of virtual metrology becomes more constrained by online production needs, such as recipe changes, different process targets, and limited amount of available training data. Existing virtual metrology methods and systems typically focus on accuracy of the virtual metrology forecast results, rather than the practicality of the implementation of virtual metrology in semiconductor fabrication facilities.

Thus, while existing virtual metrology methods and systems are generally adequate for their intended purposes, they are not satisfactory in every aspect.

SUMMARY

One of the broader forms of an embodiment of the present disclosure involves a method of fabricating a semiconductor device. The method includes, collecting a plurality of manufacturing data sets from a plurality of semiconductor processes, respectively; normalizing each of the manufacturing data sets in a manner so that statistical differences among the manufacturing data sets are reduced; establishing a database that includes the normalized manufacturing data sets; normalizing the database in a manner so that the manufacturing data sets in the normalized database are statistically compatible with a selected one of the manufacturing data sets; predicting performance of a selected one of the semiconductor processes by using the normalized database, the selected semiconductor process corresponding to the selected manufacturing data set; and controlling a semiconductor processing machine in response to the predicted performance.

Another one of the broader forms of an embodiment of the present disclosure involves a method of fabricating a semiconductor device. The method includes, providing first manufacturing data that corresponds to a first semiconductor process; transforming the first manufacturing data in a manner so that the first manufacturing data is statistically compatible with second manufacturing data that corresponds to a second semiconductor process, the second semiconductor process being different from the first semiconductor process; predicting performance of the second semiconductor process using the transformed manufacturing data; and controlling a semiconductor fabrication tool based on the predicted performance.

Yet another one of the broader forms of an embodiment of the present disclosure involves a system for wafer result prediction. The system includes: a data collector that collects a plurality of manufacturing data sets from a plurality of semiconductor processes, respectively; and a virtual metrology module that includes: a first data normalization module that normalizes each of the manufacturing data sets in a manner so that statistical differences among the manufacturing data sets are reduced, the normalized manufacturing data sets forming a database; and a second data normalization module that normalizes the database in a manner so that the manufacturing data sets in the normalized database are statistically compatible with a selected one of the manufacturing data sets; wherein the virtual metrology module: predicts performance of a selected one of the semiconductor processes that corresponds to the selected manufacturing data set; and controls a semiconductor processing machine in response to the predicted performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
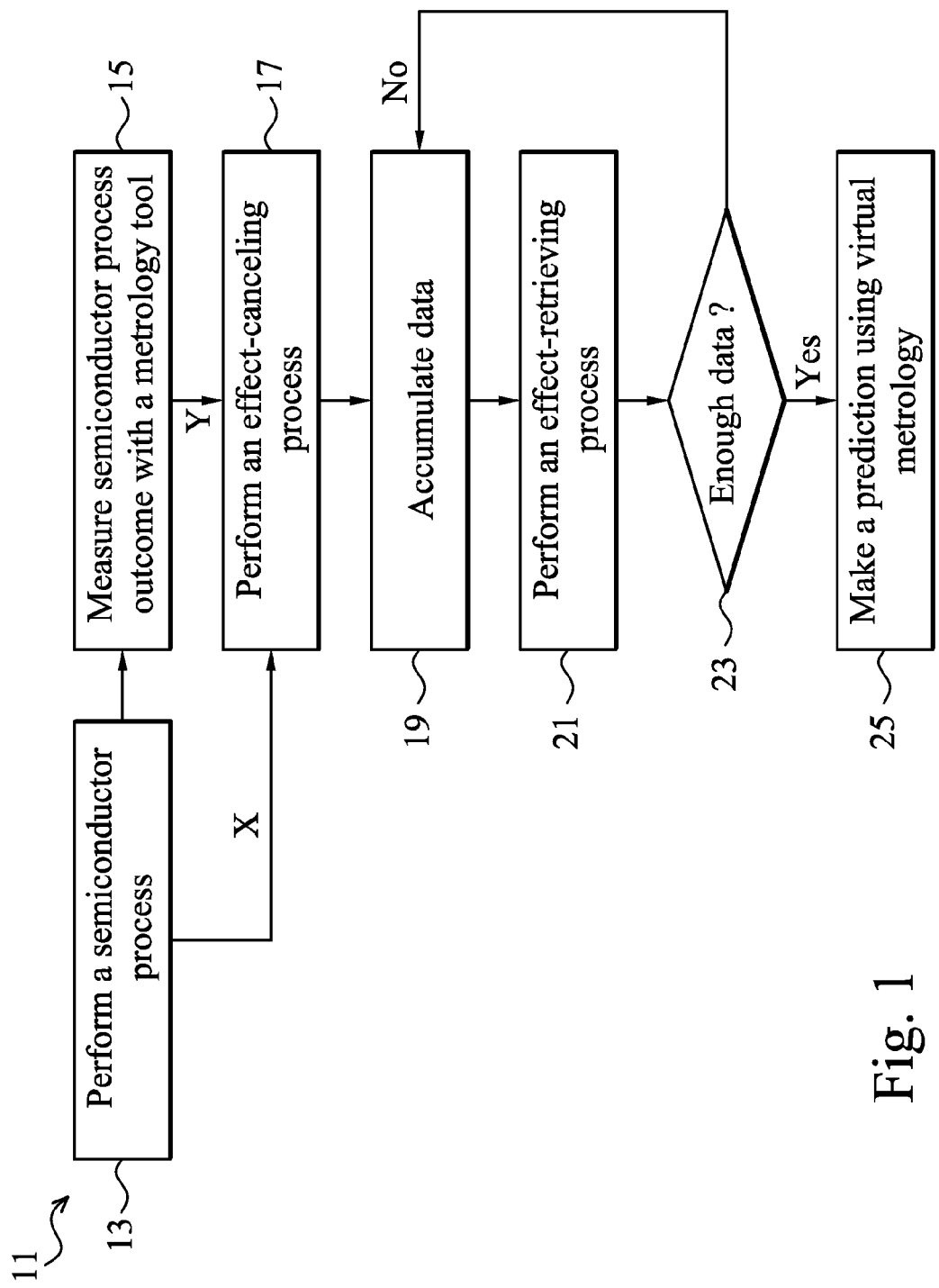
FIG. 1 illustrates a flowchart of a method of modeling a semiconductor process according to various aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 11 for using virtual metrology in semiconductor fabrication according to an embodiment of the present disclosure. The method begins with block 13 in which a semiconductor fabrication process is performed. The semiconductor fabrication process is associated with one or more fabrication tools, and may include processes such as etching, thermal oxidation, diffusion, ion implantation, RTP (rapid thermal processing), CVD (chemical vapor deposition), PVD (physical vapor deposition), epitaxy, and photolithography. Each fabrication process includes one or more fabrication input process parameters that control one or more fabrication output process parameters. The fabrication input process parameters are associated with fabrication tool settings and may serve as inputs to a fabrication tool. The fabrication output process parameters include observable outcomes or results of the fabrication process. As an example, for an etching process, fabrication input process parameters include etching time and/or etching rate. Fabrication output process parameters of the etching process include etching depth. The etching depth of the etching process can be controlled by adjusting the etching rate or etching time, which may be done by changing settings on the etching tool. It is understood that for any given fabrication process, there may be multiple fabrication input process parameters as well as multiple fabrication output process parameters. In addition, the fabrication input process parameters may also include advanced process control (APC) data, fault detection and classification (FDC) data, and quality control (QC) data.

Mathematically, the relationship between the fabrication output process parameter and the fabrication input process parameter can be expressed as $Y=f(X)$, where the Y variable represents the fabrication output process parameter (e.g. etching depth), and the X variable represents the fabrication input process parameter (e.g. etching rate or etching time). In other words, a fabrication output process parameter is a function of one or more of fabrication input process parameters.

The fabrication output process parameter (i.e., the Y variable) is measured in block 15 of the method 11 with a metrology tool (not illustrated). The measured values of the fabrication output process parameter are then outputted to a block 17 of the method 11. The fabrication input process parameter (i.e., the X variable) is also outputted by block 13 to block 17. In block 17, an effect-canceling process is performed on either the fabrication output process parameter, or the fabrication input process parameter, or both. The effect-canceling process carries out data transformation or data normalization of the fabrication output process parameter or the fabrication input process parameter. In an embodiment, the data transformation includes a mean-shifting process that will be discussed in more detail below.

After the effect-canceling process is performed in block 17, the method 11 proceeds to block 19 in which more fabrication data is accumulated. The method 11 continues with block 21 in which an effect-retrieving process is performed on the accumulated data. In an embodiment, the effect-retrieving process carries out data transformations on the accumulated data in a manner so that the effect-canceling process is undone or negated. The effect-retrieving process will be discussed in more detail below.

The method 11 continues with block 23 in which a determination is made as to whether enough data had been accumulated. If not enough data has been accumulated, the method 11 proceeds back to block 19. If enough data has been accumulated, the method 11 proceeds to block 25, in which a forecast or prediction of the performance of the semiconductor process of block 13 is made using virtual metrology.

Figure 2:
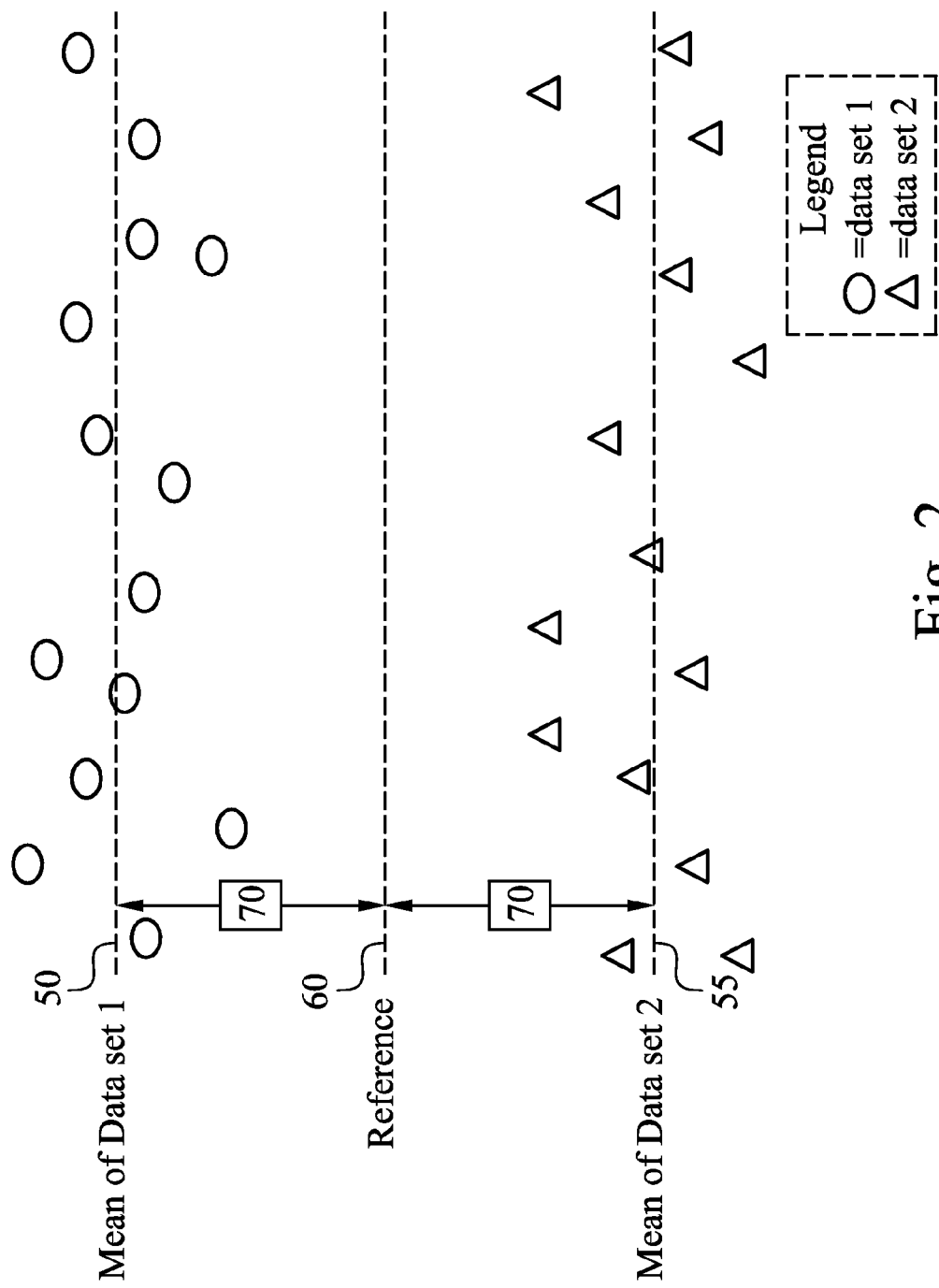
FIG. 2-4 illustrates diagrammatic views of data sets of two different semiconductor processes at various stages of data transformation.
Figure 3:
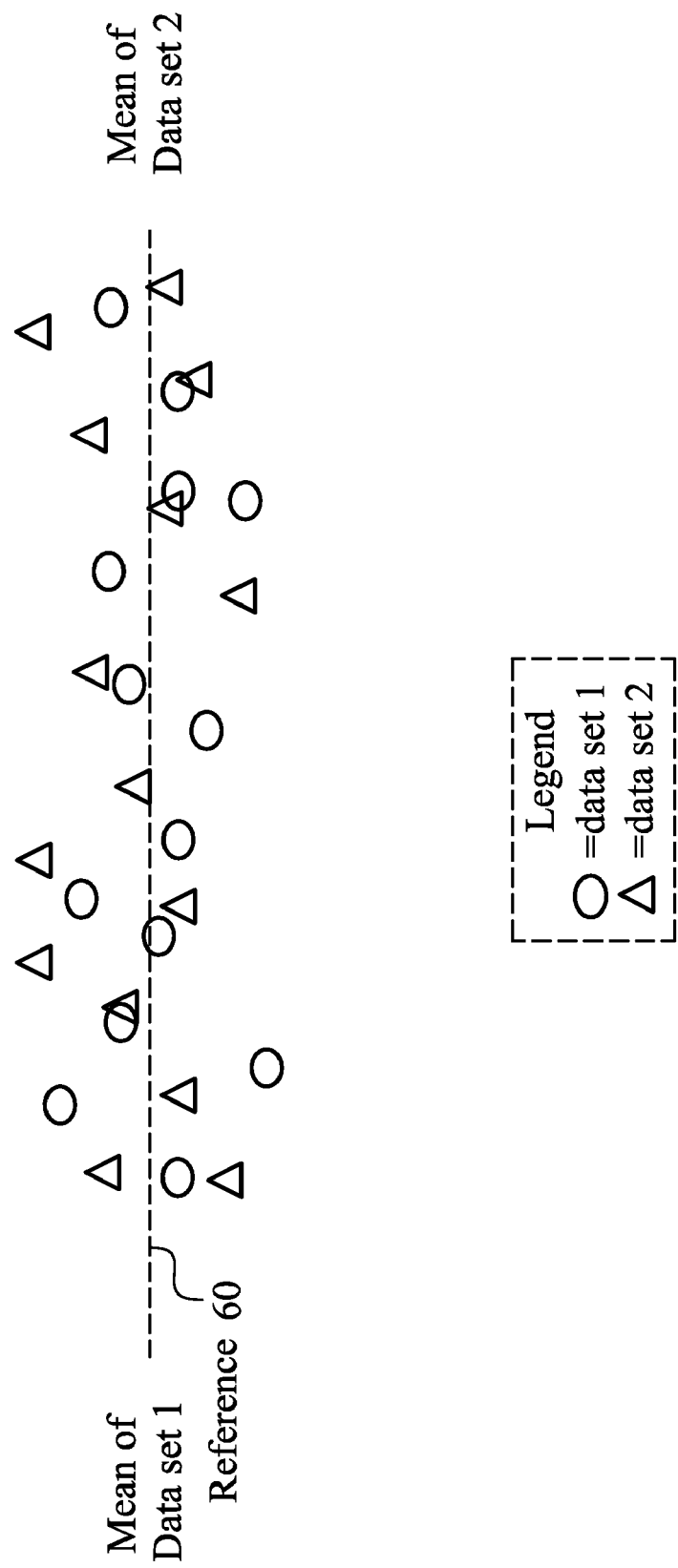
Figure 4:
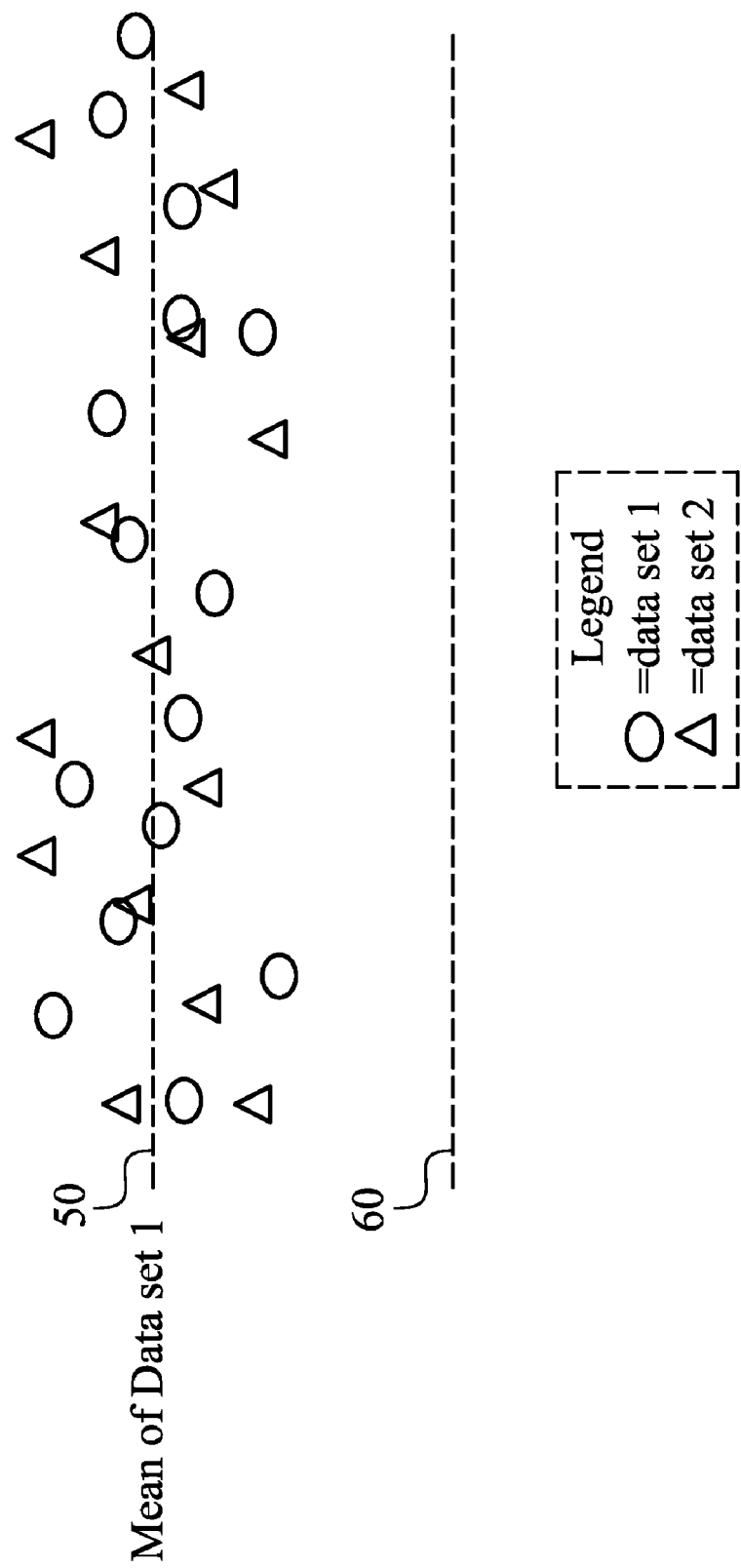

FIGS. 2-4 are diagrammatic views of data sets of two different semiconductor processes at various stages of data transformations that are associated with the effect-canceling process and the effect retrieving process of FIG. 1. Referring to FIG. 2, a data set 1 includes a plurality of data points that appear as ovals, and a data set 2 includes a plurality of data points that appear as triangles. Each data point in data set 1 corresponds to a measured etching depth of a wafer that is processed in a first processing chamber. Each data point in data set 2 corresponds to a measured etching depth of a wafer that is processed in a second processing chamber. Hence, both data sets 1 and 2 are examples of fabrication output process parameters. It is understood that etching depth is used here merely for purposes of facilitating ensuing discussions, and that data sets 1 and 2 may alternatively represent other process parameters. For example, data set 1 may alternatively represent measured etching depths of wafers that are processed using one etching recipe, and data set 2 may alternatively represent measured etching depths of wafers that are processed using a different etching recipe. In addition, though two data sets are shown here for the sake of simplicity, it is understood that multiple data sets may be used instead.

A mean (or average) of all the data points of data set 1 is illustrated as a broken line and designated at 50 in FIG. 2. A mean of all the data points of data set 2 is illustrated as a broken line and designated at 55 in FIG. 2. A reference (or a baseline) is illustrated as a broken line and designated at 60 in FIG. 2. In an embodiment, the reference 60 is the performance target (desired etching depth target) for both of the data sets 1 and 2. In another embodiment, the reference 60 may be a global or overall mean value of all of the data points of the data sets 1 and 2.

An offset 70 exists between the mean 50 and the reference 60, and an offset 75 exists between the mean 55 and the reference 60. The offsets 70 and 75 may also be referred to as "effects". These effects 70 and 75 are caused by the fact that the data sets 50 and 55 come from (or are associated with) different processing chambers. In alternative embodiments, the effects may be caused by different processing recipes, different layers, or different products. The existence of these effects puts a constraint on the amount of available training data for each virtual metrology model. In more detail, a virtual metrology model allows a prediction to be made as to the future performance of a particular semiconductor fabrication process based on previously collected data. In other words, using the previously collected data (training data) from relevant processing tools, one can forecast the electrical and physical parameters of wafers, without actually needing to make those measurements. In this manner, virtual metrology allows for the reduction and even elimination of the direct measurements.

However, accurate virtual metrology models often require large amounts of training data. Each fabrication process has its own associated training data. For example, wafers being processed in different chambers may require separate virtual metrology models, even if the product, the layer, and the processing recipes are the same. As another example, wafers that are of the same product, the same layer, and that are being processed in the same processing chamber may also require separate virtual metrology models if the processing recipes are different. As such, based on the number of permutations with respect to different products, different layers, different processing recipes, and different processing chambers, a large number of virtual metrology models may need to be established to accurately forecast the performance of all the fabrication processes. This is because each fabrication needs its own virtual metrology model for the fabrication process performance to be accurately forecast. To establish an accurate virtual metrology model, a large amount of training data needs to be provided.

However, a forecast on the performance of a fabrication process typically needs to be made with a smaller quantity of available training data. Further, the calculations for the forecast need to be made quickly, which cannot happen if data collection is still underway. As such, existing virtual metrology techniques are constrained by the lack of available training data and the time that is needed for calculations to be made (since collecting large amounts of data takes a long time). In comparison, the embodiments disclosed herein resolve issues outlined above by enabling the sharing of data between similar data sets, as discussed in detail below.

Referring now to FIG. 3, an effect-canceling process is performed to transform each data point of the data sets 1 and 2. The effect-canceling process shifts the data set 1 "downward" until its mean 50 (FIG. 2) is aligned with the reference 60, and the effect-canceling process shifts the data set 2 "upward" until its mean 55 (FIG. 2) is also aligned with the reference 60. The shifting of data sets 1 and 2 in effect transforms or normalizes each of the data points of the data sets 1 and 2 in a manner so that the effects are canceled. Thus, the data sets 1 and 2 are now statistically compatible with each other and may be shared with each other for purposes of establishing a single virtual metrology model. Stated differently, the transformed (or normalized) data sets 1 and 2 form a larger data set that contains more statistically compatible training data than either data sets 1 or 2. This larger data set can also be referred to as a data base. As discussed above, FIGS. 2 and 3 only show two data sets 1 and 2 for the sake of simplicity, and that multiple data sets may be data transformed or normalized in a similar fashion. As more data sets are integrated into the overall database, the available training data can be accumulated more quickly.

Referring now to FIG. 4, an effect-retrieving process is performed on all the data points in the overall database formed by data sets 1 and 2. The effect-retrieving process shifts all the data points "upward" until the global mean of the database is aligned with the mean 50 (FIG. 2) of data set 1. At this time, the virtual metrology model associated with data set 1 has the data points from data set 2 as available training data, in addition to the data points from data set 1. In other words, after the effect-retrieving process is performed, the shifted data set 2 becomes sufficiently statistically compatible with data set 1. Hence, a virtual metrology forecast can be made more quickly. For example, suppose a virtual metrology model for the fabrication process associated with data set 1 requires 60 wafers of data as sufficient training data. Data sets 1 and 2 each contain 30 wafers of data. Using traditional virtual metrology techniques, the fabrication process associated with data set 1 would have to accumulate more data before an accurate virtual metrology forecast can be made.

Here, since the 30 wafers of data of data set 2 can also be used as valid training data for the fabrication process associated with data set 1, the training data now contains 60 wafers of data, and as such is sufficiently large for an accurate virtual metrology forecast to be made regarding the future performance of the fabrication process associated with data set 1. It is understood that as more data sets are shared, a virtual metrology forecast can be made more quickly. For example, in an embodiment where 10 different data sets are shared into the same database, then only 6 wafers of data for each data set would result in 60 wafers of total available training data, and that a virtual metrology forecast can be made for any of the 10 fabrication processes associated with the 10 data sets. It is also understood that although the effect-retrieving process in FIG. 4 shows shifting the database "upwards" to align the reference 60 with the mean 50 of data set 1, the effect-retrieving process may shift all the data points "downward" until the reference of the database is aligned with the mean 55 (FIG. 2) of data set 2, if a virtual metrology forecast needs to be made regarding the future performance of the fabrication process associated with data set 2.

Figure 5:
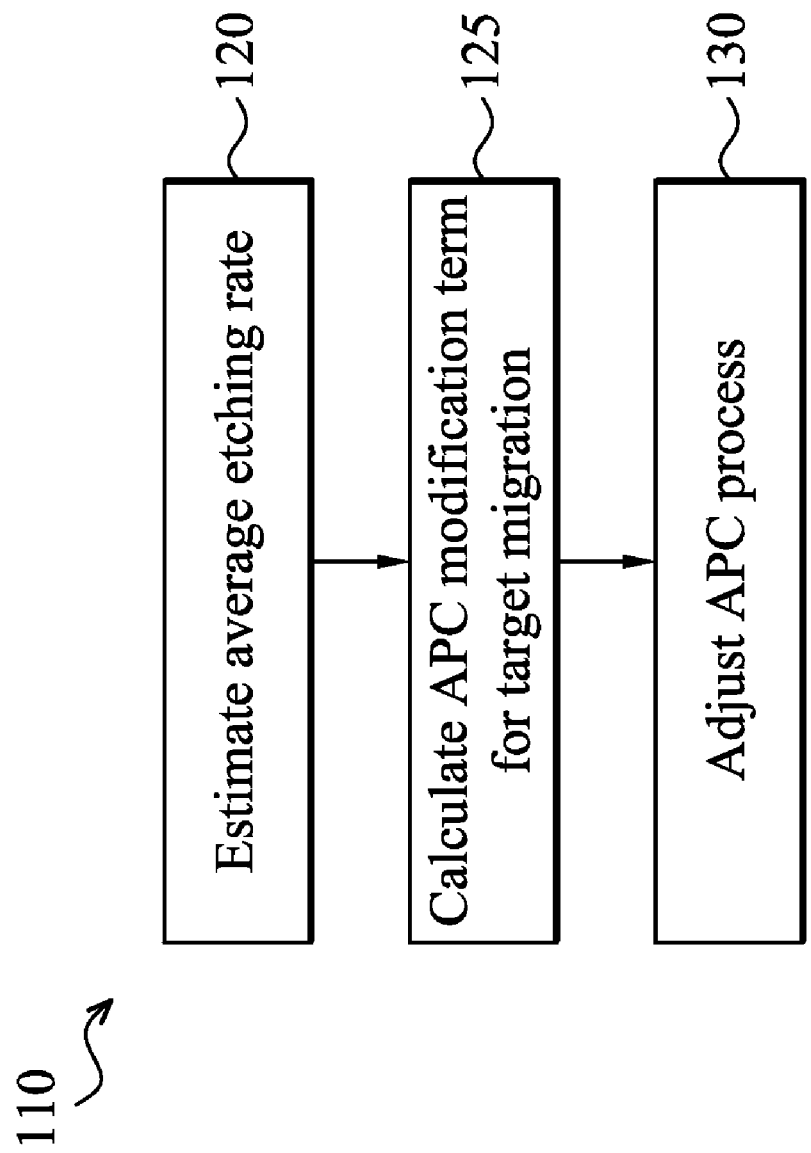
FIG. 5 is a flowchart illustrating a method of carrying out an effect-canceling process of FIG. 1.

FIG. 5 is a flowchart illustrating an example method 110 of carrying out the effect-canceling process of FIG. 1 with respect to a fabrication input process parameter. For the sake of facilitating ensuing discussions, etching processes using advanced process control (APC) are discussed below. The method 110 begins with block 120 in which an average etching rate is estimated. In etching processes, etching time can be used in the APC process to tune the etching depth. Here, a plurality of etching processes are performed, and they may have varying targets of etching depths and etching rates. Etching rate in general is defined as etching depth per unit etching time. For the plurality of etching processes, the average etching rate is expressed using the following equation:

$$\overline{ER} = \frac{\sum_{i=1}^{n} \frac{(depth_i - \overline{depth})}{(APC_i - \overline{APC})}}{n}$$

where ER represents etching rate, and depth represents etching depth, APC represents etching time, and n represents the number of etching processes.

The method 110 continues with block 125 in which an APC modification term for target migration is calculated. The APC modification term is expressed as $\Delta APC_i$ and is calculated using the following equation:

$$\Delta APC_i = \frac{depth_{Newlot}^{Target} - depth_i^{Target}}{\overline{ER}}$$

In other words, a new wafer lot associated with a new etching process has a target etching depth. The APC modification term is calculated by taking the difference between the target etching depth of the new wafer lot and the target etching depth of existing wafer lots, and then dividing the difference by the average etching rate. The APC modification term represents an amount of etching time that needs to be adjusted so that the new wafer lot will reach the target etching depth.

The method 110 continues with block 130 in which the APC process is adjusted based on the calculations performed in block 125. The equation for calculating the adjusted APC term is as follows:

$$APC_i^{adjusted} = APC_i + \Delta APC_i$$

The adjusted APC term represents the amount of etching time now needed to ensure that the etching depth of the new wafer lot will reach the new target depth. It is understood that the etching time is not actually adjusted in fabrication processing. Rather, the method 110 derives an estimated value that the etching time would have to be adjusted, so that fabrication process parameters like etching time and etching depth from different wafer lots would be become statistically compatible enough to be shared.

Figure 6:
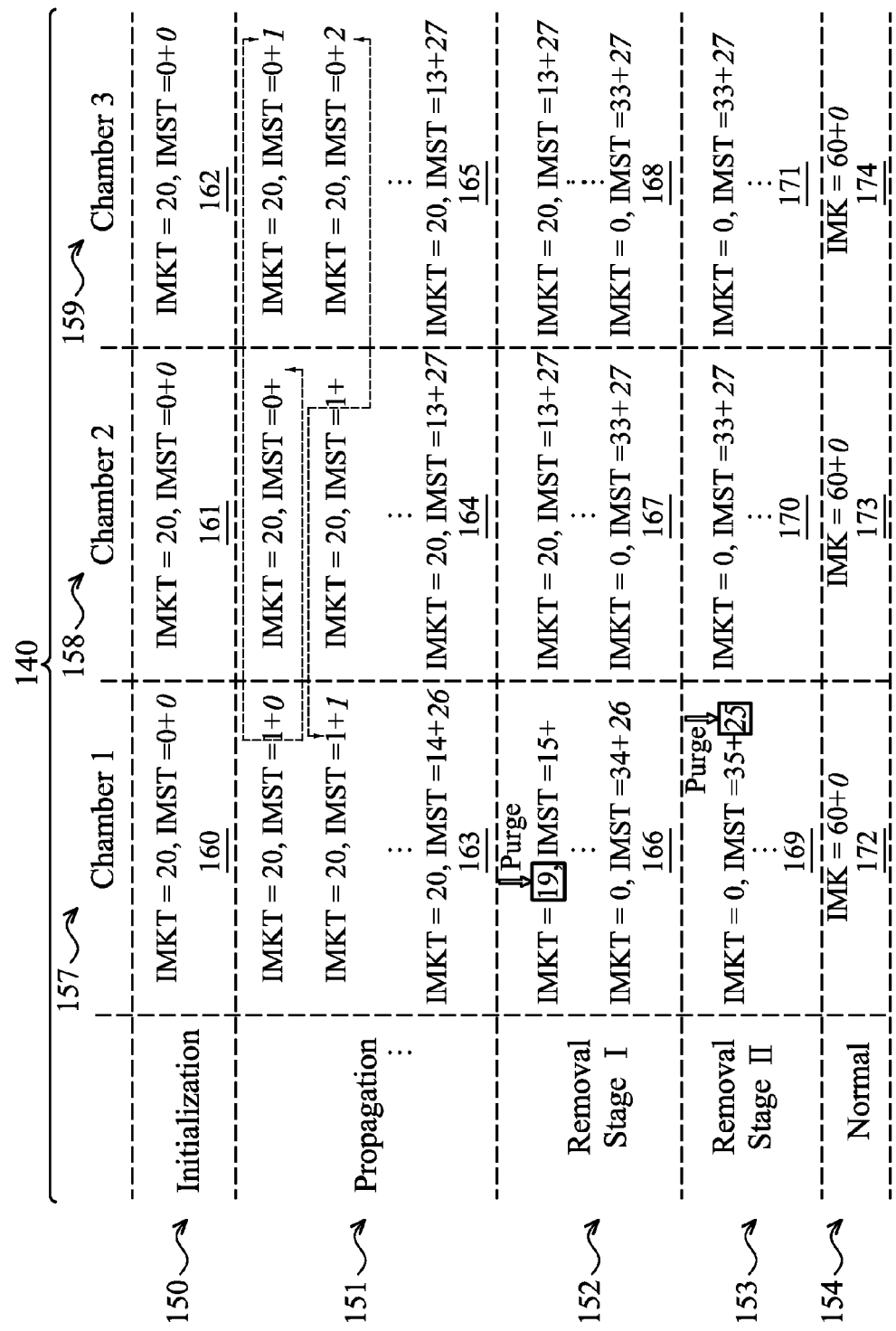
FIG. 6 illustrates a workflow diagram as an example of prioritizing data sharing and removal.

In situations where shared data sets come from multiple sources—for example, different chambers and different recipes—the present embodiment also offers a method to prioritize which data sets should be shared first and how the shared data needs to be removed once enough data has been accumulated. FIG. 6 illustrates an example embodiment of such method as a workflow diagram 140. The workflow diagram includes rows 150-154 and columns 157-159. The rows 150-154 denote different stages of data sharing, which are initialization, propagation, removal stage I, removal stage II, and normal, respectively. The Columns 157-159 denote three different processing chambers, which are chamber 1, chamber 2, and chamber 3, respectively.

The rows 150-154 and columns 157-159 form cells 160-174. Within each cell, "IMKT" represents data associated with one recipe, and "IMST" represents data associated with a different recipe. A number following IMKT indicates the number of wafers on which fabrication data associated with the IMKT recipe have been collected. Two numbers follow IMST. The first number indicates the number of wafers on which fabrication data associated with the IMST recipe have been collected. The second number (italicized) also indicates the number of wafers on which fabrication data associated with the IMST recipe have been collected, though that fabrication data comes from a different chamber. To illustrate, at the initialization stage 150, in cell 160, IMKT=20, and IMST=0+0. This means that for chamber 1, there are 20 wafers of data available for the IMKT recipe, but no data (actual data or shared data) is available for the IMST recipe. Nevertheless, a virtual metrology forecast can still be made for the IMST recipe by using the IMKT recipe as baseline (or initialization) data. Alternatively stated, since no concrete data is available for the IMST process, the 20 wafers of IMKT data can be used as substitute for the IMST data since they are similar. It is understood that the IMKT data has already been effect-canceled and effect-retrieved at this point.

After the initialization stage 150 is the propagation stage 151. In the first line of cell 163, IMKT=20, which means the 20 wafers of IMKT data is still shared. IMST=1+0, which means one wafer of IMST data has actually been collected on the wafer in chamber 1, but there is no shared IMST data that comes from chambers 2 and 3. Meanwhile, the IMST data collected by the wafer in chamber 1 is shared to cells 161 and 162. As such, the first lines of cells 164 and 165 both show IMST=0+1, where the 1 indicates one wafer of IMST data that is associated with chamber 1 and shared to cells 164 and 165.

The second line of cell 164 shows IMST=1+1, meaning that a wafer of IMST data associated with the chamber 2 has been collected. This data is then shared to cells 163 and 165, as reflected by the second line of cell 163 showing IMST=1+1, and the second line of cell 165 showing IMST=0+2. Although not shown, IMST data is next collected for chamber 3, which will then be shared to cells 163 and 164. The process discussed above continues until the last line of cells 163-165, at which point cell 163 contains 20 wafers of shared IMKT data, 14 wafers of actual IMST data associated with chamber 1, and 26 wafers of shared IMST data associated with chambers 2 and 3. Cell 164 contains 20 wafers of shared IMKT data, 13 wafers of actual IMST data associated with chamber 2, and 27 wafers of shared IMST data associated with chambers 1 and 3. Cell 165 contains 20 wafers of shared IMKT data, 13 wafers of actual IMST data associated with chamber 3, and 27 wafers of shared IMST data associated with chambers 2 and 3.

At this time, a relatively accurate virtual metrology forecast can be made for the particular fabrication process associated with each cell, since each cell now has a total of 60 wafers of data. For example, a virtual metrology model can be established for wafers that are processed in chamber 1 and using the IMST recipe, even though only 14 wafers of such type of data have actually been collected. 20 out of the 60 wafers of data come from IMKT data, which are shared into cell 163 and serve as data that is statistically compatible with IMST data. 26 out of the 60 wafers of data are IMST data but come from other processing chambers 2 and 3. Thus, as discussed above, it can be seen that the data sharing approach enables one to make virtual metrology forecasts more quickly than traditionally possible. Further, for the sharing of the IMKT data and the IMST data associated with other chambers to occur, the effect-canceling and effect-retrieving processes discussed above with reference to FIGS. 1-4 are performed first, since the effect-canceling and effect-retrieving processes make the shared data become statistically compatible with the actual data.

Following the propagation stage 151 is the removal stage I 152. In removal stage I 152, the shared IMKT data are gradually purged or removed, as more IMST data is collected. The reason for the removal of IMKT data is that, between shared IMKT data and shared IMST data associated with a different chamber, the IMKT data is less statistically relevant to the actual IMST data on which a virtual metrology forecast is to be made. Alternatively stated, the IMST data associated with chambers 2 and 3 will more accurately represent IMST data associated with chamber 1, compared to the IMKT data. Thus, as seen in cell 166, IMKT=19, meaning that 1 wafer of IMKT data is removed. At the same time, IMST=15+26, meaning that 1 more wafer of IMST data associated with chamber 1 has been collected. The total number of wafers of data is still 60, and the virtual metrology model established using this batch of 60 wafers of data will make a more accurate virtual metrology forecast than the model established using the 60 wafers of data in cell 163. The purging of the IMKT data continues until the end of the removal stage I 152, at which point there are no more shared IMKT data.

The removal stage II 153 follows the removal stage I 152. In this stage, the shared IMST data associated with other chambers are removed. As an example, in cell 169, IMKT=0 (indicating no shared IMKT data), and IMST=35+25. Compare this to the last line of cell 166, in which IMST=34+26, it can be seen that the first number following IMST has been incremented, while the second number following IMST has been decremented. This means that as 1 more wafer of IMST data associated with chamber 1 is collected, 1 wafer of data associated with chambers 2 or 3 is removed from cell 169. The removal of IMST data associated with other chambers continues until stage normal 154, where the only data left in each cell 172-174 is the IMST data associated with its respective chamber. At this stage, since enough actual data exists for each virtual metrology model, there is no need to have data sharing, though in other embodiments data sharing can still be done if desired.

It is understood that the workflow diagram 140 is not limited to the sharing and purging of data with respect to different processing chambers and different recipes and may alternatively be used to share and purge data with respect to different products or different layers of the same product.

Figure 7:
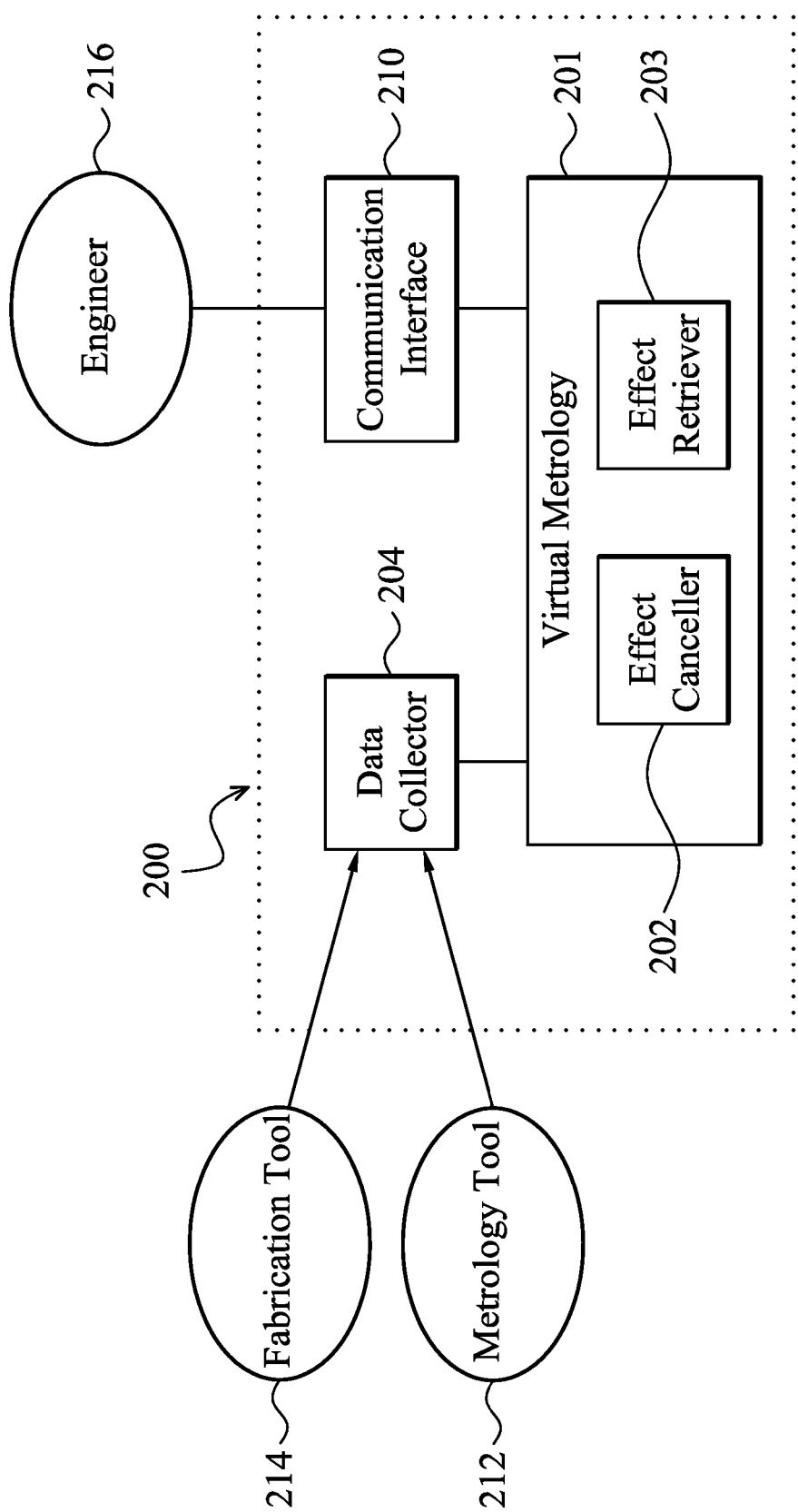
FIG. 7 illustrates a block diagram of a fabrication tool, a metrology tool, and a virtual metrology system (VM system) for performing the method of FIG. 1.

FIG. 7 is a high level block diagram showing a fabrication tool, a metrology tool, and a virtual metrology system (VM system) for performing the method of FIG. 1. A VM system 200 includes a virtual metrology module (VM module) 201 that is operable to perform actions including manipulating information, receiving information, storing information, and transferring information. The information may include, for example, commands, process parameters such as those parameters used in process recipes, manufacturing data, advanced process control parameters, and fabrication tool status. The VM module 201 includes an effect-canceller module 202 and an effect-retriever module 203. The effect-canceller module 202 performs data transformations necessary to carry out the effect-canceling process discussed above with reference to FIGS. 1-3. For example, the effect-canceller module may be operable to perform a mean-shifting process on its input data. The effect-retriever module 203 performs data transformations necessary to carry out the effect-retrieving process discussed above with reference to FIGS. 1 and 4. The effect-retriever module may also be operable to perform a mean-shifting process on its input data. The VM system 200 further includes a data collector module 204 and a communication interface module 210.

A metrology tool 212 and a fabrication tool 214 are coupled to the VM system 200. The metrology tool 212 may include electrical, optical, and/or analytical tools, such as microscopes, micro-analytical tools, line-width measurement tools, mask and reticle defects tools, particle distribution tools, surface analysis tools, stress analysis tools, resistivity and contact resistance measurement tools, mobility and carrier concentration measurement tools, depth measurement tools, film thickness measurement tools, gates oxide integrity test tools, C-V measurement tools, focused ion beam, and other test and measurement tools.

The fabrication tool 214 may include, etching tools, chemical vapor deposition (CVD) tools, physical vapor deposition (PVD) tools, atomic layer deposition (ALD) tools, thermal oxidation tools, ion implantation tools, chemical mechanical polishing (CMP) tools, rapid thermal annealing (RTA) tools, photolithography tools, or other proper semiconductor fabrication tools.

The metrology tool 212 and the fabrication tool 214 respectively output wafer data and tool data to the data collector module 204, which then sends the wafer data and tool data to the VM module 201 for analysis and modeling. The wafer data and the tool data may be collectively referred to as manufacturing data. The wafer data includes the fabrication output process parameters (i.e., the Y variable) discussed above with reference to FIG. 1. The fabrication output process parameters may be wafer parameters such as trench depth, sheet resistance, reflectivity, stress, particle density, critical dimension, leakage current, and threshold voltage, to name a few. The wafer data may further include other data such as wafer ID and product type.

The tool data includes the fabrication input process parameters (i.e., the X variable) discussed above with reference to FIG. 1. The fabrication input process parameters may include the setting values of process parameters, which may be changed by adjusting the settings of the fabrication tool 214. In a CMP process, for example, the fabrication input process parameters may include polishing pressure, platen rotational speed, slurry distribution rate, slurry temperature, and wafer temperature. In PVD, as another example, the fabrication input process parameters may include heater temperature, wafer temperature, radio frequency (RF) bias reflected power, RF side reflected power, RF top reflected power, chamber pressure, gas partial pressures, and chuck voltage. The fabrication input process parameters may also include other parameters not included in a process recipe such as sputtering target thickness and spacing between the target and the wafer for the PVD tool. The tool data may further include other data such as tool ID, tool maintenance history, and material specification (such as slurry composition in CMP and sputtering target in PVD).

A semiconductor wafer, either individually or in batch, is processed through various fabrication process steps. One process step may be performed in the fabrication tool 214. Other process steps may be performed in other fabrication tools. The fabrication tool 214 may be programmed, set, and configured according to a process recipe when the wafer is processed therein, for example by adjusting the fabrication input process parameters for the fabrication tool. The process recipe may define a plurality of sub-steps. For example, a PVD tool recipe may define the following sub-processes: gas, ramp, stabilization, deposition, and pump-down. Each sub-process may be defined with a certain time duration and may set various hardware parameters to certain levels. After the wafer completes the process step in the fabrication tool 214 according to the process recipe, one or more of the metrology tools 212 may be utilized to test and measure the wafer to get wafer data or results. The wafer data and tool data are then collected by the data collector 204 from the metrology tool 212 and the fabrication tool 214, respectively, and stored in memory in the VM system 200. The data stored in memory may later be retrieved by the VM metrology module 201 and be processed by the effect-canceller module 202 and the effect-retriever module 203.

Performance of a semiconductor process is predicted using the VM module 201. For example, the wafers may be processed by the fabrication tool 214 and the process parameters have been set in accordance with the specified process recipe. Additionally, current tool data and wafer can be collected in real-time and routed to pertinent modules of the VM system 200 for analysis. The VM module 201 makes a prediction on a process result (or wafer result) of the semiconductor process based on the current data in conjunction with the previous data that is stored in memory.

The predicted wafer result may be sent out to pertinent engineers or customers of the fab. Further, the predicted wafer result may be fed forward to control subsequent semiconductor processes or may be fed backward to tune the current semiconductor process. Additionally, the predicted wafer result may be used to adjust the process recipe for subsequent wafers. Accordingly, the VM system 200 may be used to substitute for the physical metrology operations that are performed by an engineer using metrology tools (e.g., metrology tool 212) in order to measure actual wafer results. Thus, the VM system 200 can be implemented in Computer Integrated Manufacturing (CIM) applications so that the predicted results may used to determine whether the wafers are within design specifications for virtual wafer acceptance testing (WAT).

For example, the communication interface 210 may communicate the predicted wafer result within the semiconductor fabrication environment. For example, the predicted wafer result may be sent to engineers 216 for evaluation, production monitor, and/or process improvement. The engineers 216 may communicate with the VM system 200 through the communication interface 210. The communication interface 210 may even provide an alarm to the engineers 216 when the predicted wafer results are out of a predefined range, has apparent shifting, or has other serious changes. The predicted wafer result may be sent to a data control center such as a manufacturing execution system (MES) system wherein the predicted wafer result may be further processed, organized, and distributed for data monitoring, evaluation, analysis, and/or control such as statistical process control (SPC). The predicted wafer result may be sent to a fabrication tool at a next semiconductor process, wherein the process recipe and process parameters may be adjusted to compensate for any drifting and/or shifting from the current semiconductor process for optimized wafer quality, performance, and yield.

The VM system 200 of FIG. 2 serves as an example to the present disclosure. Each module thereof may include software and/or hardware to implement its functions. For example, the VM module 201 may include hardware such as computer and memory for operation and storage. The VM module 201 may also include software for providing an operating environment. The VM system 200 may further include a database that stores all process parameters, manufacturing data, pool of functional transformations, and optimization algorithms. Each module may be well configured, connected to other modules and other components of the semiconductor fabrication environment. The VM system 200 may be configured and organized in different ways such as with less or more modules without departure from the spirit of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   collecting a plurality of manufacturing data sets from a plurality of semiconductor processes, respectively, wherein each manufacturing data set has a mean associated therewith;
   normalizing each of the manufacturing data sets in a manner so that statistical differences among the manufacturing data sets are reduced, wherein normalizing each of the manufacturing data sets includes shifting the mean associated with each manufacturing data set to a reference mean such that each manufacturing data set has the same reference mean;
   establishing a database that includes the normalized manufacturing data sets;
   normalizing the database in a manner so that the manufacturing data sets in the normalized database are statistically compatible with a selected one of the manufacturing data sets, wherein normalizing the database includes shifting the reference mean of each manufacturing data set to one the means that was associated with one of the manufacturing data sets prior to normalizing each of the manufacturing data sets;
   predicting performance of a selected one of the semiconductor processes by using the normalized database, the selected semiconductor process corresponding to the selected manufacturing data set; and
   controlling a semiconductor processing machine in response to the predicted performance.

2. The method of claim 1, wherein the predicting the performance includes constructing a virtual metrology model corresponding to the selected semiconductor process, and wherein the virtual metrology model uses the normalized database as training data.

3. The method of claim 1, wherein the plurality of manufacturing data sets correspond to input fabrication process parameters of the plurality of semiconductors processes, respectively.

4. The method of claim 3, wherein the input fabrication process parameters are selected from the group consisting of: polishing pressure, platen rotational speed, slurry distribution rate, slurry temperature, wafer temperature, heater temperature, wafer temperature, radio frequency (RF) bias reflected power, RF side reflected power, RF top reflected power, chamber pressure, gas partial pressures, chuck voltage, etching time, etching rate, advanced data control (APC) data, fault detection and classification (FDC) data, quality control (QC) data, and combinations thereof.

5. The method of claim 1, wherein the plurality of manufacturing data sets correspond to output fabrication process parameters of the plurality of semiconductors processes, respectively.

6. The method of claim 5, wherein the output fabrication process parameters are selected from the group consisting of: etching depth, sheet resistance, reflectivity, stress, particle density, critical dimension, leakage current, threshold voltage, and combinations thereof.

7. The method of claim 1, further including updating the database by:
   ranking the plurality of manufacturing data sets based on their respective statistical data compatibility with the selected manufacturing data set;
   adding more data points to a first manufacturing data set of the plurality of manufacturing data sets; and
   removing data points from a second manufacturing data set of the plurality of manufacturing data sets;
   wherein the first manufacturing data set has a greater statistical data compatibility with the selected manufacturing data set than the second manufacturing data set.

8. A method of fabricating a semiconductor device, comprising:
   providing first manufacturing data that corresponds to a first semiconductor process, wherein the first manufacturing data has a first mean;
   transforming the first manufacturing data in a manner so that the first manufacturing data is statistically compatible with second manufacturing data that corresponds to a second semiconductor process, the second semiconductor process being different from the first semiconductor process, wherein transforming the first manufacturing data includes shifting the first mean of the first manufacturing data and a second mean of the second manufacturing data to a reference mean such that first manufacturing data and the second manufacturing data have the same reference mean and then shifting the reference mean of the first and second manufacturing data to one of the first and second means;
   predicting performance of the second semiconductor process using the transformed manufacturing data; and
   controlling a semiconductor fabrication tool based on the predicted performance.

9. The method of claim 8, wherein the reference mean is an average of the first mean of the first manufacturing data and the second mean of the second manufacturing data.

10. The method of claim 8, wherein the predicting the performance includes establishing a virtual metrology model for the second semiconductor process, the virtual metrology model using the transformed first manufacturing data as training data.

11. A system for wafer result prediction, comprising:
   a data collector that collects a plurality of manufacturing data sets from a plurality of semiconductor processes, respectively, wherein each manufacturing data set has a mean associated therewith; and
   a virtual metrology module that includes:
      a first data normalization module that normalizes each of the manufacturing data sets in a manner so that statistical differences among the manufacturing data sets are reduced, the normalized manufacturing data sets forming a database, wherein normalizing each of the manufacturing data sets, by the first data normalization module, includes shifting the mean associated with each manufacturing data set to a reference mean such that each manufacturing data set has the same reference mean; and a second data normalization module that normalizes the database in a manner so that the manufacturing data sets in the normalized database are statistically compatible with a selected one of the manufacturing data sets, wherein normalizing the database, by the second data normalization module, includes shifting the reference mean of each manufacturing data set to one the means that was associated with one of the manufacturing data sets prior to normalizing each of the manufacturing data sets by the first data normalization module;

wherein the virtual metrology module:
predicts performance of a selected one of the semiconductor processes that corresponds to the selected manufacturing data set; and
controls a semiconductor processing machine in response to the predicted performance.

12. The system of claim 11, wherein the manufacturing data sets correspond to one of wafer result data and fabrication tool data, and wherein the wafer result data is a function of the fabrication tool data.

13. The system of claim 11, wherein the reference mean is an average of the means associated with each of the plurality of manufacturing data sets.

14. The system of claim 11, wherein the plurality of manufacturing data sets correspond to at least one of input fabrication process parameters and output fabrication process parameters of the plurality of semiconductors processes.

15. The system of claim 14, wherein the input fabrication process parameters are selected from the group consisting of: polishing pressure, platen rotational speed, slurry distribution rate, slurry temperature, wafer temperature, heater temperature, wafer temperature, radio frequency (RF) bias reflected power, RF side reflected power, RF top reflected power, chamber pressure, gas partial pressures, chuck voltage, etching time, etching rate, advanced data control (APC) data, fault detection and classification (FDC) data, quality control (QC) data, and combinations thereof; and wherein the output fabrication process parameters are selected from the group consisting of: etching depth, sheet resistance, reflectivity, stress, particle density, critical dimension, leakage current, threshold voltage, and combinations thereof.

16. The method of claim 1, wherein predicting performance of the selected one of the semiconductor processes by using the normalized database includes using data from all of the plurality of manufacturing data sets.

17. The method of claim 1, wherein the reference mean is an performance target mean associated with one of the plurality of semiconductor processes.

18. The method of claim 8, wherein predicting performance of the second semiconductor process using the transformed manufacturing data includes using the first and second manufacturing data to predict the performance of the second semiconductor process.

19. The method of claim 8, wherein transforming the first manufacturing data includes shifting the first mean of the first manufacturing data, the second mean of the second manufacturing data, and a third mean of a third manufacturing data to the reference mean such that first manufacturing data, the second manufacturing data, and third manufacturing data have the same reference mean and then shifting the reference mean of the first, second, and third manufacturing data to one of the first, second, and third means.

20. The method of claim 8, further comprising after transforming the first manufacturing data, determining whether enough manufacturing data has been transformed prior to predicting performance of the second semiconductor process using the transformed manufacturing data.

* * * * *